(12) United States Patent
Fukuzumi

(10) Patent No.: US 6,894,919 B2
(45) Date of Patent: May 17, 2005

(54) MAGNETIC RANDOM ACCESS MEMORY

(75) Inventor: Yoshiaki Fukuzumi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 273 days.

(21) Appl. No.: 10/369,768

(22) Filed: Feb. 21, 2003

(65) Prior Publication Data

US 2004/0105303 A1 Jun. 3, 2004

(30) Foreign Application Priority Data

Nov. 28, 2002 (JP) ........................................ 2002-346038

(51) Int. Cl.[7] .............................................. G11C 11/00
(52) U.S. Cl. ........................ 365/158; 365/171; 257/295
(58) Field of Search ................................ 365/158, 171; 257/295

(56) References Cited

U.S. PATENT DOCUMENTS

| | | | | |
|---|---|---|---|---|
| 5,389,566 A | * | 2/1995 | Lage ............................. | 438/3 |
| 5,940,319 A | | 8/1999 | Durlam et al. | |
| 5,956,267 A | | 9/1999 | Hurst et al. | |
| 6,473,336 B1 | * | 10/2002 | Nakajima et al. ........... | 365/171 |
| 6,573,586 B2 | * | 6/2003 | Sakata et al. ............... | 257/529 |
| 6,587,370 B2 | * | 7/2003 | Hirai .......................... | 365/171 |

FOREIGN PATENT DOCUMENTS

WO    WO 00/10172    2/2000

OTHER PUBLICATIONS

Roy Scheuerlein, et al. "A 10ns Read and Write Non–Volatile Memory Array Using a Magnetic Tunnel Junction and FET Switch in Each Cell" ISSCC 2000 Digest Paper TA 7.2, 2000, pp. 128–129.

Masahige Sato, et al. "Spin–Valve–Like Properties of Ferromagnetic Tunnel Junctions" Jpn. J. Appl. Phys., vol. 36, Part 2, No. 2B, Feb. 15, 1997, pp. 200–201.

Koichiro Inomata, et al. "Spin–Dependent Tunneling Between a Soft Ferromagnetic Layer and Hard Magnetic Nanosize Particles" Jpn. J. Appl. Pys. vol. 36, Part 2, No. 10B, Oct. 15, 1997, pp. 1380–1383.

* cited by examiner

Primary Examiner—Hoai Ho
(74) Attorney, Agent, or Firm—Oblon, Spivak, McClelland, Maier & Neustadt, P.C.

(57) ABSTRACT

An MRAM includes a magnetoresistance element configured to store data, an electric current drive line configured to selectively apply a magnetic field to the magnetoresistance element, and a magnetic circuit configured to hold the magnetic field applied from the electric current drive line. The electric current drive line includes a first side facing the magnetoresistance element, a second side reverse to the first side, and two lateral sides between the first and second sides. The magnetic circuit includes a pair of film members consisting essentially of a ferromagnetic material and extending along the two lateral sides of the electric current drive line, such that portions facing the first and second sides of the electric current drive line are left open.

19 Claims, 5 Drawing Sheets

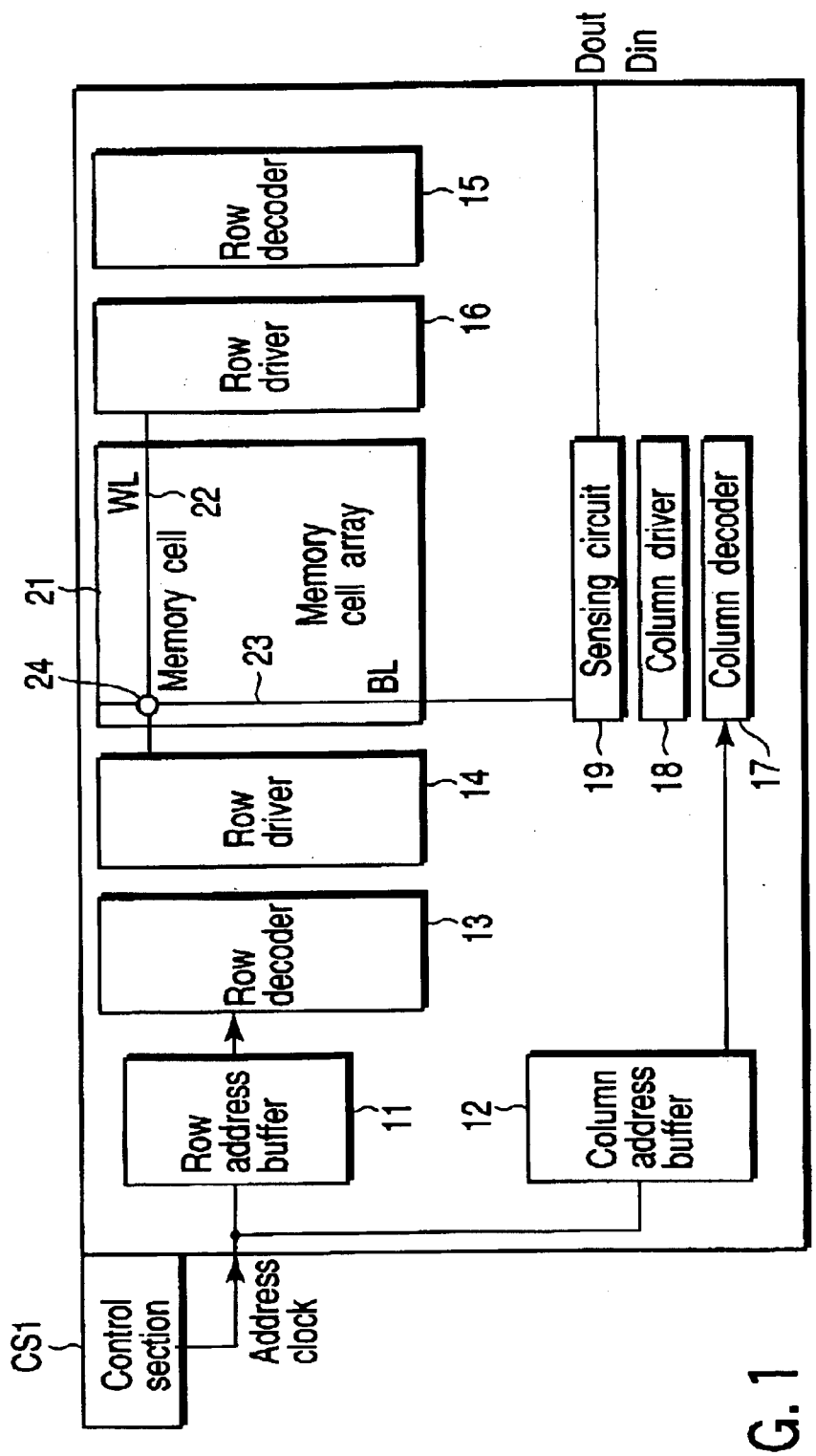
F I G. 1

MAGNETIC RANDOM ACCESS MEMORY

CROSS-REFERENCE TO RELATED APPLICATIONS

This application is based upon and claims the benefit of priority from the prior Japanese Patent Application No. 2002-346038, filed Nov. 28, 2002, the entire contents of which are incorporated herein by reference.

BACKGROUND OF THE INVENTION

1. Field of the Invention

The present invention relates to a magnetic random access memory having memory cells, each using a magnetoresistance element that stores data by means of the magnetoresistance effect.

2. Description of the Related Art

"Magnetic random access memory" (which will be referred to as MRAM) is a generic name of solid memories that can rewrite, hold, and read record information, as the need arises, by utilizing the magnetization direction of a ferromagnetic body used as an information recording carrier.

In general, each of the memory cells of the MRAM has a structure in which a plurality of ferromagnetic bodies are stacked one on the other. Information recording is performed by assigning units of binary information "1" and "0" respectively to parallel and anti-parallel states, i.e., the relative positions in magnetization, of the plurality of ferromagnetic bodies forming each memory cell. When record information is written, the magnetization direction of a ferromagnetic body of each cell is inverted by a magnetic field generated by electric currents fed through write lines, which are disposed in a criss-cross fashion. The MRAM is a nonvolatile memory, which, in principle, has zero power consumption during record holding, and record holding is maintained even after power off. Record information is read by utilizing the so-called magnetoresistance effect, in which the electric resistance of each memory cell varies in accordance with the angle between the magnetization direction of a ferromagnetic body in each memory cell and the sense current, or angle between the magnetization directions of a plurality of ferromagnetic layers.

The MRAM has many advantages in function, as shown in the following (1) to (3), as compared to conventional semiconductor memories using a dielectric body. (1) It is completely nonvolatile, and allows the number of rewriting operations to be more than $10^{15}$. (2) It allows nondestructive reading, and requires no refreshing operation, thereby shortening read cycles. (3) As compared to memory cells of the charge accumulation type, it has a high radiation-tolerance. The MRAM may have an integration degree per unit area, and write and read times, almost the same as those of the DRAM. Accordingly, it is expected that the MRAM will be applied to external recording devices for portable equipment, hybrid LSIs, and primary storage for personal computers, making the most of the specific feature of nonvolatility.

At present, feasibility studies are being carried out regarding practical use of the MRAM, in which each memory cell employs, as a magnetoresistance element, an MTJ (Magnetic Tunnel Junction) element that forms a ferromagnetic tunnel junction (for example, Roy Scheuerlein, et al., "A 10 ns Read and Write Non-Volatile Memory Array Using a Magnetic Tunnel Junction and FET Switch in each Cell", 2000 ISSCC Digest of Technical Papers, US, February 2000, pp. 128–129). The MTJ element is formed mainly of a three-layered film, i.e., ferromagnetic layer/insulating layer/ferromagnetic layer, in which an electric current flows by tunneling through the insulating layer. The electric resistance of the junction varies in proportion to the cosine of the relative angles in magnetization of the two ferromagnetic metal layers. The resistance becomes maximum when the magnetization directions are anti-parallel with each other. This is called the TMR (Tunneling Magneto-Resistance) effect. For example, in the case of $NiFe/Co/Al_2O_3/Co/NiFe$, a magnetoresistance change rate of more than 25% is observed with a low magnetic field of 50 Oe or less.

As a structure of the MTJ element, there is known a so-called spin valve structure type, in which an anti-ferromagnetic body is disposed adjacent to one of two ferromagnetic bodies to fix its magnetization direction, so as to improve the magnetic field sensitivity (for example, M Sato, et al., "Spin-Valve-Like Properties of Ferromagnetic Tunnel Junctions", Jpn. J. Appl. Phys., 1997, Vol. 36, Part 2, pp. 200–201). There is also known a type in which double tunnel barriers are disposed to improve bias dependency of the magnetoresistance change rate (for example, K Inomata, et al., "Spin-dependent tunneling between a soft ferromagnetic layer and hard magnetic nano particles", Jpn. J. Appl. Phys., 1997, Vo. 36, Part 2, pp. 1380–1383).

However, in order to develop MRAMs having an integration degree of Class-Gb, there are several problems that still need to be solved. One of them is that the writing current needs to be reduced. In the conventional MRAM, an electric current is caused to flow through an interconnection line to generate a magnetic field, thereby inverting the magnetization direction of the record layer of an MTJ element. The magnetic field intensity generated by the interconnection line varies, depending on the value of the electric current fed through the interconnection line, and the distance between the interconnection line and MTJ element. According to conventional reports, the magnetic field intensity is about several Oe/mA. The threshold for inverting the magnetization direction of the record layer of the MTJ element, which will be defined as switching magnetic field Hsw, increases in inverse proportion to the size of the MTJ element in the hard magnetization axis direction, which will be defined as cell width w.

$$Hsw=Hsw0+A/w \tag{1}$$

where the conventionally known value of A is 10 to 20 (Oe·$\mu$m).

In light of the reliability of an interconnection line, electro-migration imposes a restriction thereon. The rate of electro-migration depends on the electric current density in the interconnection line. In an Al—Cu interconnection line and a Cu interconnection line presently used in LSI manufacture, the upper limit of electric current density is about 10 mA/$\mu$m$^2$ and 100 mA/$\mu$m$^2$, respectively. In consideration of manufacture under a 0.1-$\mu$m rule necessary for realizing the integration degree of Class-Gb, even where an interconnection line is formed of a Cu interconnection line, the upper limit of electric current value acceptable for the interconnection line is about 1 mA, and the value of a magnetic field generated thereby is several Oe. On the other hand, the switching magnetic field for an MTJ element with a size of about 0.1 $\mu$m is several 10 Oe or more, in accordance with the formula (1). As a consequence, it is very difficult to realize an MRAM of the Class-Gb using present techniques.

In order to solve this problem, a device with a keeper layer or yoke structure (magnetic circuit), which is made of a magnetic material having a high magnetic permeability and is disposed around an interconnection line, has been proposed (for example, U.S. Pat. Nos. 5,940,319 and 5,956,267, International Publication WO 00/10172, and Jpn. Pat. Appln. KOKAI Publication No. 8-306014). These devices are designed to cause the magnetic flux generated around the interconnection line to converge into the keeper layer or yoke structure, thereby intensifying the magnetic field generated around an MTJ element, so as to reduce the writing current value.

Of the above, the "yoke structure", as shown in FIG. 9, is a structure that can be practically manufactured under the 0.1-$\mu$m rule necessary for realizing the integration degree of Class-Gb. As shown in FIG. 9, electric current drive lines 2 are respectively and electrically connected to two MTJ elements 1. Each of the electric current drive lines 2 includes a line core portion 3 made of a low-resistivity metal, such as Al, a barrier metal film 4 made of, e.g., TaN, and a high magnetic permeability film 5 made of, e.g., Ni. The high magnetic permeability film 5 functions as a yoke for holding a magnetic field. The barrier metal film 4 prevents interdiffusion of metals between the line core portion 3 and high magnetic permeability film 5, thereby improving the reliability of the MRAM.

As described later in more detail, the present inventor has found that, where the yoke structure shown in FIG. 9 is applied to an MRAM in practice, several problems arise, such as an increase in the interconnection line resistivity, and an increase in the connection resistivity.

BRIEF SUMMARY OF THE INVENTION

According to a first aspect of the present invention, there is provided a magnetic random access memory comprising:

a magnetoresistance element configured to store data;

an electric current drive line configured to selectively apply a magnetic field to the magneto-resistance element; and a magnetic circuit configured to hold the magnetic field applied from the electric current drive line, wherein the electric current drive line comprises a first side facing the magnetoresistance element, a second side reverse to the first side, and two lateral sides between the first and second sides, and the magnetic circuit comprises a pair of film members consisting essentially of a ferromagnetic material and extending along the two lateral sides of the electric current drive line, such that portions facing the first and second sides of the electric current drive line are left open.

According to a second aspect of the present invention, there is provided a magnetic random access memory comprising:

a memory cell array including memory cells respectively disposed at addresses arranged in a matrix format, each of the memory cells including a magnetoresistance element as a storing element;

word lines respectively connected to rows of the memory cell array;

bit lines respectively connected to columns of the memory cell array;

partition walls extending along and between respective pairs of electric current drive lines, which are the word lines or the bit lines configured to selectively apply magnetic fields respectively to the magneto resistive elements, wherein each of the partition walls comprises first and second film members consisting essentially of a ferromagnetic material and forming parts of first and second magnetic circuits, which are configured to respectively hold magnetic fields applied from first and second electric current drive lines extending adjacent to and parallel with each other, and the first and second film members are electrically insulated from the first and second electric current drive lines respectively by insulating layers.

BRIEF DESCRIPTION OF THE SEVERAL VIEWS OF THE DRAWING

FIG. 1 is a block diagram showing an MRAM according to a first embodiment of the present invention;

DETAILED DESCRIPTION OF THE INVENTION

Figure 9:
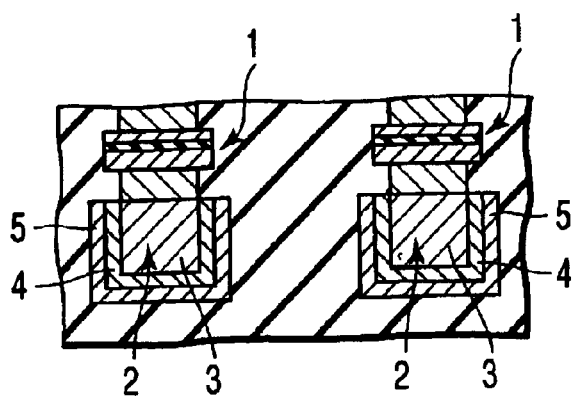
FIG. 9 is a sectional view showing conventional electric current drive lines of an MRAM.

In the process of developing the present invention, the inventor studied problems caused where the yoke structure shown in FIG. 9 was applied to an MRAM in practice. As a result, the inventor arrived at the following findings.

Specifically, in compliance with a 0.1-$\mu$m rule generation, the electric current drive line 2 comes to have a line width of about 100 nm. In this respect, the high magnetic permeability film 5 of the yoke structure preferably secures a film thickness of, e.g., about 10 nm. Furthermore, the barrier metal film 4 preferably secures a film thickness of, e.g., about 5 nm. As a consequence, the yoke structure shown in FIG. 9 is formed with a line width of 100 nm, of which the high magnetic permeability film 5 counts for 10 nm on either side, i.e., totally 20 nm, and the barrier metal film 4 counts for 5 nm on either side, i.e., totally 10 nm.

Accordingly, the margin left for a real interconnection line material decreases to about 70 nm=100 nm−20 nm−10 nm. Namely, in spite of the 0.1-$\mu$m generation, the width of a real interconnection line material decreases to about 70 nm. This brings about an increase in electric current density in an interconnection line, whereby reliability against electromigration may not be sufficiently attained, despite using the yoke structure.

The yoke structure shown in FIG. 9 further gives rise to the following problem. Specifically, the electric current drive line 2 may be electrically connected to a switching element (not shown) on a lower side, depending on the MRAM type. In this case, the yoke structure shown in FIG. 9 includes the resistance of the high magnetic permeability film 5 and barrier metal film 4 as a connection resistance in series at the bottom of the electric current drive line 2. Since the MRAM requires a change of several percent to tens of percent in MTJ element resistance to be detected, the large resistance included in series reduces the read margin, thereby causing a serious problem.

Embodiments of the present invention achieved on the basis of the findings given above will now be described with reference to the accompanying drawings. In the following description, the constituent elements having substantially the same function and arrangement are denoted by the same reference numerals, and a repetitive description will be given only when necessary.

First Embodiment

FIG. 1 is a block diagram showing an MRAM according to a first embodiment of the present invention. This MRAM has a memory chip configuration of the synchronism type.

The MRAM has a memory cell array 21 formed of memory cells 24 respectively disposed at addresses arranged in a matrix format. Each of the memory cells 24 includes a magnetoresistance element (MTJ element) as a storing element. Word lines 22 are respectively connected to the rows of the memory cell array 21, and bit lines 23 are respectively connected to the columns of the memory cell array 21. In FIG. 1, the word lines 22 represent both write word lines and read word lines, for the sake of simplicity.

A row address buffer 11, row decoders 13 and 15, and row drivers 14 and 16 are disposed to select the word lines 22. A column address buffer 12, column decoder 17, and column driver 18 are disposed to select the bit lines 23. A sensing circuit 19 is connected to the bit lines 23, for reading stored data.

The row address buffer 11 and column address buffer 12 are connected to a control section CS1 for generating address signals, data signals, and so forth. The control section CS1 is disposed on a substrate common to the memory cell array 21, or is formed as a device separate from the memory cell array 21. Address signals from the control section CS1 are temporarily latched in the row address buffer 11 and column address buffer 12.

In reading, a row and column are respectively selected by the row decoder 13 and column decoder 17, on the basis of latched address signals. In writing, a bit line 23 with an address corresponding to a selected memory cell 24 is fed with an electric current from the column driver 18, and, at the same time, a word line 22 with an address corresponding to the selected memory cell 24 is fed with an electric current from each of the right and left row drivers 16 and 14 in accordance with information to be written.

Figure 2:
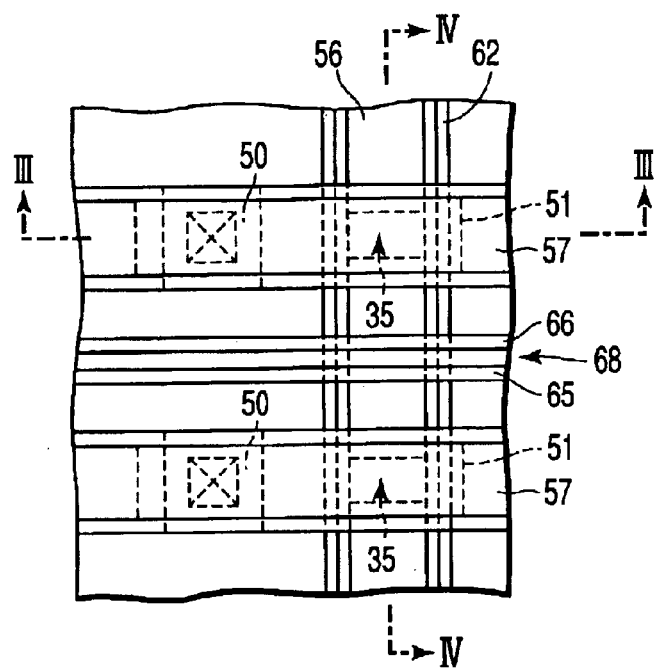
FIG. 2 is a plan view showing a part corresponding to two memory cells of the MRAM according to the first embodiment of the present invention.
Figure 3:
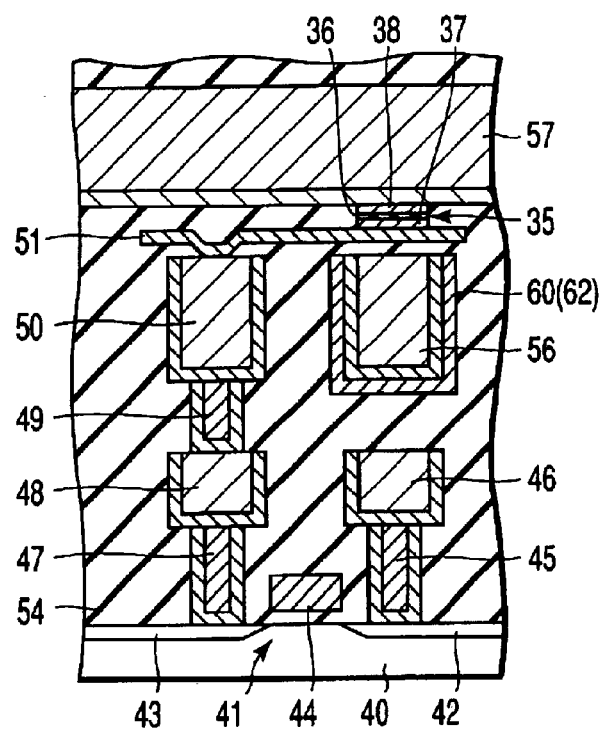
FIG. 3 is a sectional view cut along a line III—III in FIG. 2.
Figure 4:
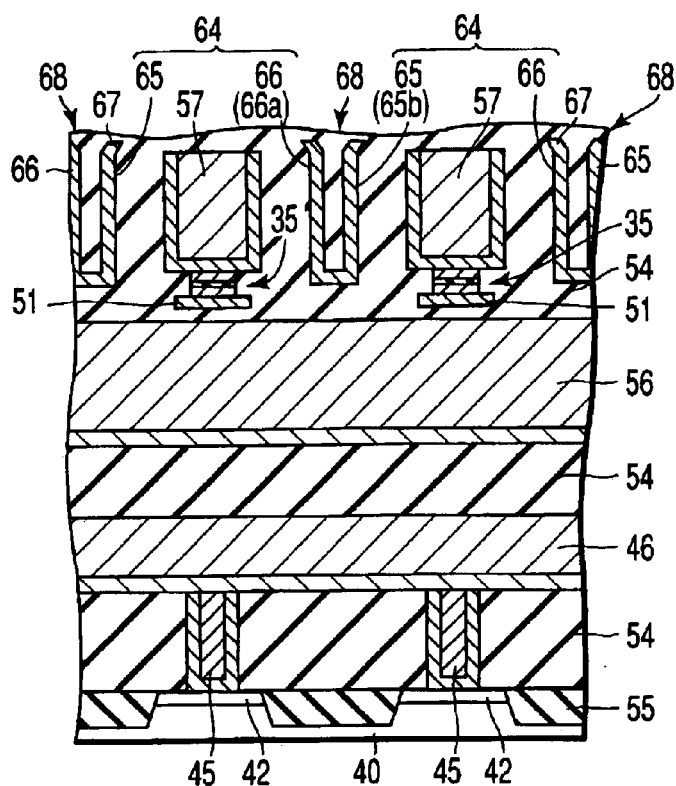
FIG. 4 is a sectional view cut along a line IV—IV in FIG. 2.

FIG. 2 is a plan view showing a part corresponding to two memory cells of the MRAM according to the first embodiment of the present invention. FIGS. 3 and 4 are sectional views cut along a line III—III and a line IV—IV in FIG. 2, respectively.

On a semiconductor substrate 40, an MOS transistor 41 used as a switching element for reading is formed. The MOS transistor 41 has a source diffusion layer 42 and drain diffusion layer 43 formed in the surface of the substrate 40, a gate electrode 44 disposed on a channel region in the surface of the substrate 40 with a gate insulating film interposed therebetween. The gate electrode 44 is formed of a part of a read word line (represented by a word line 22 in FIG. 1), which extends perpendicular to the sheet plane of FIG. 3. The source diffusion layer 42 is connected to a read source line 46 via a plug 45.

On the other hand, the drain diffusion layer 43 of the MOS transistor 41 is connected to an MTJ element 35 via plugs 47 and 49, and interconnection layers 48, 50, and 51. The MTJ element 35 is disposed between the interconnection layer 51 and a bit line 57 (represented by a bit line 23 in FIG. 1), which is one of electric current drive lines for writing. Directly below the MTJ element 35, a write word line 56 (represented by a word line 22 in FIG. 1), which is the other of the electric current drive lines for writing, is disposed with an insulating film interposed therebetween. The write word line 56 extends in a direction (row direction) perpendicular to a direction (column direction) in which the bit line 57 extends. In FIGS. 3 and 4, reference symbols 54 and 55 denote an interlayer insulating film and device isolation insulating film, respectively.

The write word lines 56 and bit lines 57 extend perpendicular to each other, as shown in FIG. 2, to form a cross-matrix. One MTJ element 35 disposed at each intersection of the write word lines 56 and bit lines 57 corresponds to one memory cell 24 shown in FIG. 1. Data is written in the MTJ element 35 by a magnetic field formed by an electric current flowing through the write word line 56 and an electric current flowing through the bit line 57. In FIGS. 3 and 4, the bit line 57 is disposed above the write word line 56, but a reversed structure may be adopted.

As shown in FIGS. 3 and 4, each of the write word lines 56 and bit lines 57, i.e., electric current drive lines for writing, has a ratio of height to width in the sectional view (aspect ratio), set to be 1 or more, and preferably 1.5 to 3. Since each electric current drive line has a tall rectangular cross section, the sectional area of the electric current drive line increases, thereby suppressing an increase in electric current density. As a consequence, the electro-migration in the interconnection line, which is accelerated by the electric current density, is suppressed, thereby improving the reliability of the MRAM.

The MTJ element 35 has a spin valve structure including a record layer 37 and pinned layer 38 disposed to sandwich a tunnel barrier film (insulating film) 36, wherein data is stored in the record layer 37. The record layer 37 is formed of a ferromagnetic layer consisting of a single-layered or multi-layered film in which at least one layer is made of a ferromagnetic alloy containing Fe, Ni, and Co. The easy magnetization axis direction of the record layer 37 is perpendicular to the extending direction of the write word line 56. The bottom of the record layer 37 is electrically connected to the interconnection layer 51.

On the other hand, the pinned layer 38 is formed of a laminated structure with a ferromagnetic layer and high coercivity layer stacked in this order from the tunnel barrier film 36 side. The ferromagnetic layer consists of a single-layered or multi-layered film in which at least one layer is made of a ferromagnetic alloy containing Fe, Ni, and Co. The high coercivity layer includes an anti-ferromagnetic layer consisting of at least one thin film which is made of an anti-ferromagnetic body, such as PtMn. The top of the high coercivity layer is electrically connected to the bit line 57.

The MTJ element 35 may be formed of an MTJ element having a dual spin valve structure. In this case, the MTJ element 35 has two tunnel barrier films disposed to sandwich a record layer, and two pinned layers disposed one on either outside of the two tunnel barrier films. The structures of the record layer and each of the pinned layers may be the same as those described above, for example. Where the dual spin valve structure is adopted, it is possible to reduce a decrease in magnetoresistance change rate relative to the applied voltage, and to increase the breakdown voltage.

In order to hold the magnetic field applied from each write word line 56, the write word line 56 is provided with a magnetic circuit 60. The magnetic circuit 60 is formed of a yoke film 62 disposed on the both sides and bottom of the write word line 56. The yoke film 62 consists essentially of a ferromagnetic material, and preferably a soft-magnetic material having a high magnetic permeability.

On the other hand, in order to hold the magnetic field applied from each bit line 57, the bit line 57 is provided with a magnetic circuit 64. The magnetic circuit 64 is formed of a pair of film members 65 and 66 extending along the opposite sides of the bit line 57, such that the portions facing the top and bottom sides of the bit line 57 are left open. Each of the film members 65 and 66 consists essentially of a ferromagnetic material, and preferably a soft-magnetic material having a high magnetic permeability. Since the film members 65 and 66 leave the portions facing the top and bottom sides of the bit line 57 in opened states, the bit line 57 can be electrically connected to a multi-layered interconnection line structure more easily and reliably. In this case, the interconnection line structure includes no resistance component in series due to part of the magnetic circuit 64, thereby improving the read margin.

Each of the film members 65 and 66 of the magnetic circuit 64 is buried in the interlayer insulating film 54, and electrically insulated from the corresponding bit line 57 by the interlayer insulating film 54. Each of the film members 65 and 66 has a vertical length such that it extends beyond the top and bottom of the bit line 57. In other words, the vertical length of the film members 65 and 66 is larger than the vertical length (the distance between the top and bottom) of the bit line 57. The top of each of the film members 65 and 66 is provided with a portion 67 inclined toward the bit line 57. Such film members 65 and 66 can reliably hold the magnetic field applied from the bit line 57.

Between two bit lines 57 adjacent to each other, the right film member 66 of the left bit line 57 (see reference symbol 66a in FIG. 4) and the left film member 65 of the right bit line 57 (see reference symbol 65b in FIG. 4) are part of an integrally formed film having a U-shape. The concave of the U-shaped film, i.e., the portion between the two film members 66a and 65b is filled with an insulating layer, so that a partition wall 68 is formed as a whole. The partition wall 68 extends in parallel with and midway between the two bit lines 57.

Since the two bit lines 57 adjacent to each other essentially share the film members 65 and 66 of the magnetic circuit 64, the area occupied by the magnetic circuit 64 decreases in the MRAM. In other words, the electric current drive line can be given a sufficient sectional area that much. The film members 65 and 66 of the magnetic circuit 64 are insulated from the bit line 57 by the interlayer insulating film 54. In this case, it is possible to omit the barrier metal film 4 used in the conventional structure shown in FIG. 9 for preventing metals from inter-diffusing between the line core portion 3 and high magnetic permeability film 5. With this arrangement, the reliability of the MRAM improves and the number of manufacturing steps decreases.

Where the bit line (electric current drive line) 57 has a high aspect ratio, as in this embodiment, the film members 65 and 66 of the magnetic circuit 64 disposed only on lateral sides of the interconnection line allows the magnetic field applied to the MTJ element 35 to be effectively increased. For example, experiments were conducted in cases where the magnetic circuit 64 according to this embodiment was applied and not applied to the electric current drive line. In these two cases, the electric current drive line was set to have an aspect ratio of 2, and was supplied with the same electric current. As a result, the ratio between these two cases in magnetic field generated near the MTJ element 35 was about 1:3 (i.e., this embodiment showed a magnetic field about three times larger). This effect was enhanced with an increase in height of the film members 65 and 66 relative to the height of the bit line 57.

As described above, the yoke film 62, and film members 65 and 66 of the magnetic circuits 60 and 64 consists essentially of a ferromagnetic material, and preferably a soft-magnetic material having a high magnetic permeability. Specifically, the material of these members may be a magnetic material having a high magnetic permeability, such as a Ni-based alloy, e.g., Permalloy or Mo-added Permalloy, or an Fe-based alloy, e.g., Sendust or Finemet™. Furthermore, an oxide ferromagnetic body, e.g., ferrite, may be used.

Rewriting operations of the MRAM employ a writing current having a pulse width of 100 ns or less in general. Accordingly, the material of the magnetic circuit needs to have a property such that the magnetization response can follow the writing current pulse. For this purpose, the material preferably satisfies (1) the initial magnetic permeability is at least 100 or more, (2) the saturated magnetization is small, (3) the resistivity is high. In order to satisfy these requirements, for example, an alloy described above may be added with an additive that easily forms intergranular precipitation, such as a metalloid, e.g., Si or B, or a metal, e.g., Cu, Cr, or V, so that a micro-crystalline aggregate or amorphous of the alloy is formed. Furthermore, the shape of the alloy may be optimized for magnetic domain control in the magnetic circuit.

Second Embodiment

Figure 5:
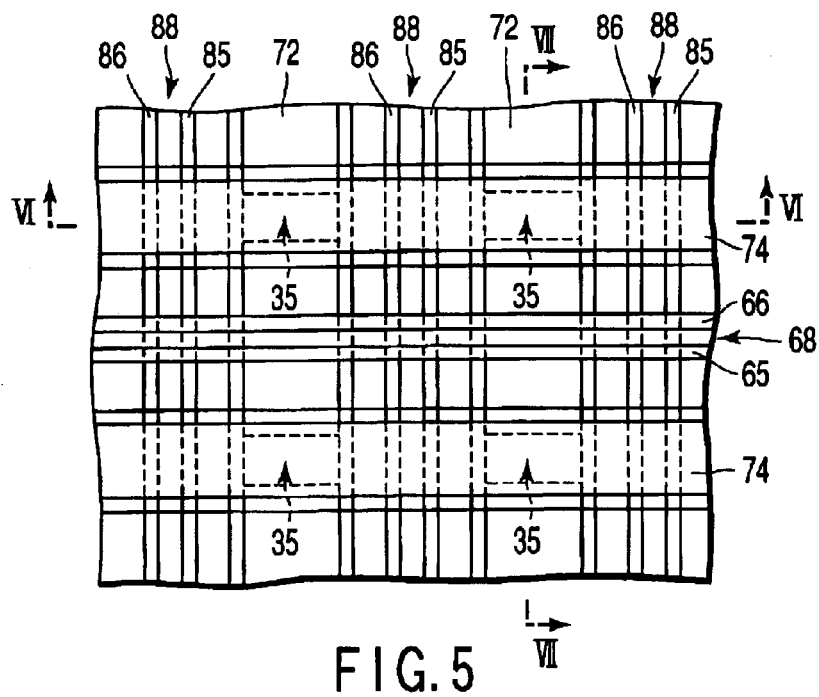
FIG. 5 is a plan view showing a part corresponding to four memory cells of an MRAM according to a second embodiment of the present invention.
Figure 6:
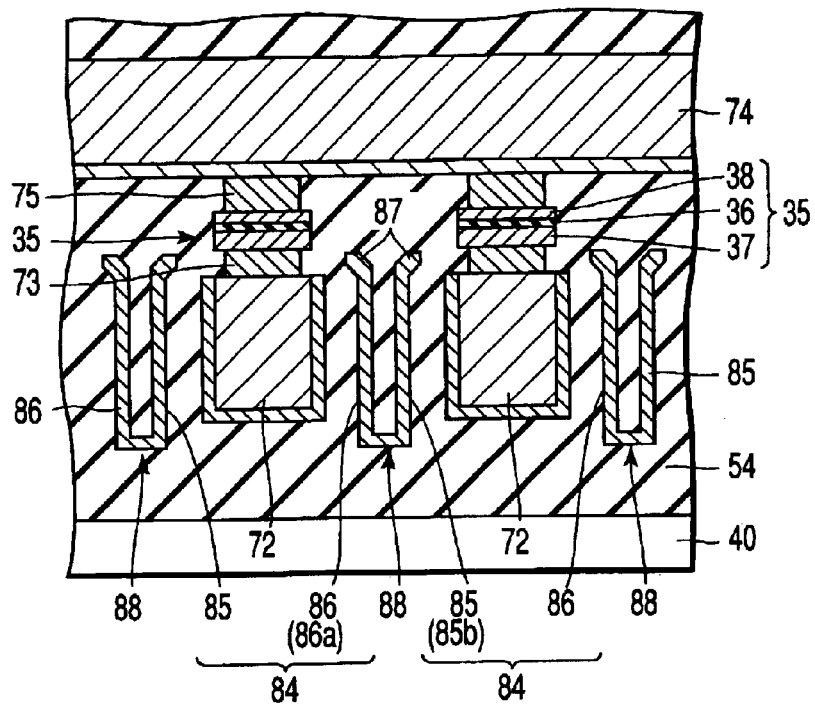
FIG. 6 is a sectional view cut along a line VI—VI in FIG. 5.
Figure 7:
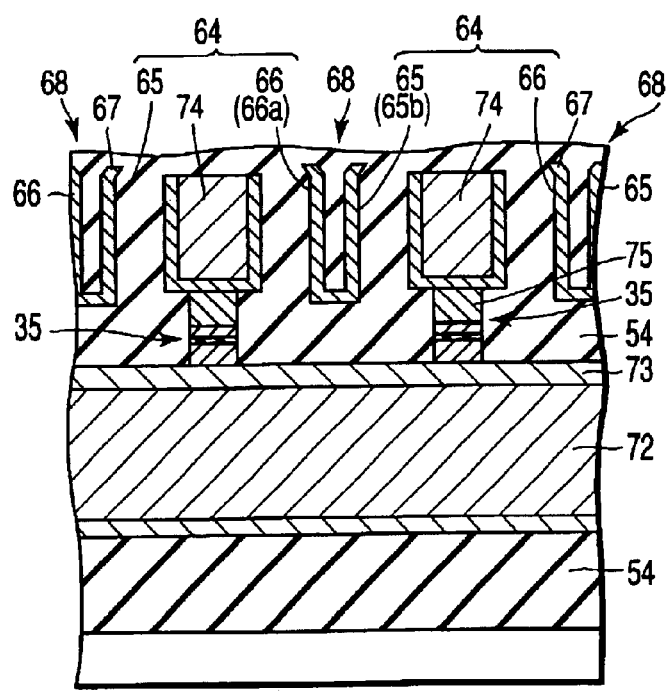
FIG. 7 is a sectional view cut along a line VII—VII in FIG. 5.

FIG. 5 is a plan view showing a part corresponding to four memory cells of an MRAM according to a second embodiment of the present invention. FIGS. 6 and 7 are sectional views cut along a line VI—VI and a line VII—VII in FIG. 5, respectively. This MRAM has a structure of the so-called cross point type. The block diagram showing the entire structure of the MRAM according to this embodiment is substantially the same as that shown in FIG. 1.

A plurality of word lines (represented by a word lines 22 in FIG. 1) 72 and a plurality of bit lines (represented by a bit line 23 in FIG. 1) 74 are disposed perpendicular to each other in an interlayer insulating film 54 formed on a semiconductor substrate 40. An MTJ element 35 is disposed at each intersection of the write word lines 56 and bit lines 57, i.e. each intersection of electric current drive lines. The MTJ element 35 has a spin valve structure including a record layer 37 and pinned layer 38 disposed to sandwich a tunnel barrier film (insulating film) 36, wherein data is stored in the record layer 37.

Each of the write word lines 72 and bit lines 74 has a ratio of height to width in the sectional view (aspect ratio), set to be 1 or more, and preferably 1.5 to 3. The MTJ element 35 is electrically connected to the corresponding word line 72 and bit line 74 though interconnection line portions 73 and 75, respectively. The word line 72 and bit line 74 are used commonly for both data writing and reading. Specifically, data is written into the MTJ element 35 by a magnetic field, which is generated by electric currents fed through the word line 72 and bit line 74 functioning as electric current drive lines. In FIGS. 6 and 7, the bit line 74 is disposed above the word line 72, but a reversed structure may be adopted.

In such an MRAM of the cross point type, it is necessary to pay attention to the potential difference between the word line 72 and bit line 74 appearing in writing. Specifically, when data is written in the MTJ element 35, there is a case where a high voltage is generated between the word line 72 and bit line 74 by the writing current. Since the word line 72 and bit line 74 are electrically connected to each other, the tunnel barrier film 36 may cause dielectric breakdown due to the high voltage. In order to avoid this problem, for example, an element having a rectifying function may be connected in series to the MTJ element 35, or a rectifying function may be given to the MTJ element 35 itself. Alternatively, a change in circuitry may be used to prevent a high voltage from being applied to the MTJ element 35.

In order to hold the magnetic field applied from each bit line 74, the bit line 74 is provided with a magnetic circuit 64. The magnetic circuit 64 is formed of a pair of film members 65 and 66 extending along opposite sides of the bit line 74, such that the portions facing the top and bottom sides of the bit line 74 are left open. The magnetic circuit 64 shown in FIG. 6 is disposed at substantially the same position, and formed of the same material and structure, as the magnetic circuit 64 shown in FIG. 3, and thus no explanation will be given thereof.

On the other hand, in order to hold the magnetic field applied from each word line 72, the word line 72 is provided with a magnetic circuit 84. The magnetic circuit 84 is formed of a pair of film members 85 and 86 extending along opposite sides of the word line 72, such that the portions facing the top and bottom sides of the word line 72 are left open. The film members 85 and 86 consist essentially of the same material as the film members 65 and 66 of the magnetic circuit 64 shown in FIG. 3.

Each of the film members 85 and 86 of the magnetic circuit 84 is buried in the interlayer insulating film 54, and electrically insulated from the corresponding word line 72 by the interlayer insulating film 54. Each of the film members 85 and 86 has a vertical length such that it extends beyond the top and bottom of the word line 72. The top of each of the film members 85 and 86 is provided with a portion 87 inclined toward the word line 72.

Between two word lines 72 adjacent to each other, the right film member 86 of the left word line 72 (see reference symbol 86a in FIG. 6) and the left film member 85 of the right word line 72 (see reference symbol 85b in FIG. 6) are part of an integrally formed film having a U-shape. The concave of the U-shaped film, i.e., the portion between the two film members 86a and 85b is filled with an insulating layer, so that a partition wall 88 is formed as a whole. The partition wall 88 extends in parallel with and midway between the two word lines 72.

Since the word line 72 is provided with the magnetic circuit 84 having the structure described above, the same effect as described with reference to the magnetic circuit 64 shown in FIG. 3 is attained for the word line 72.

Figure 8:
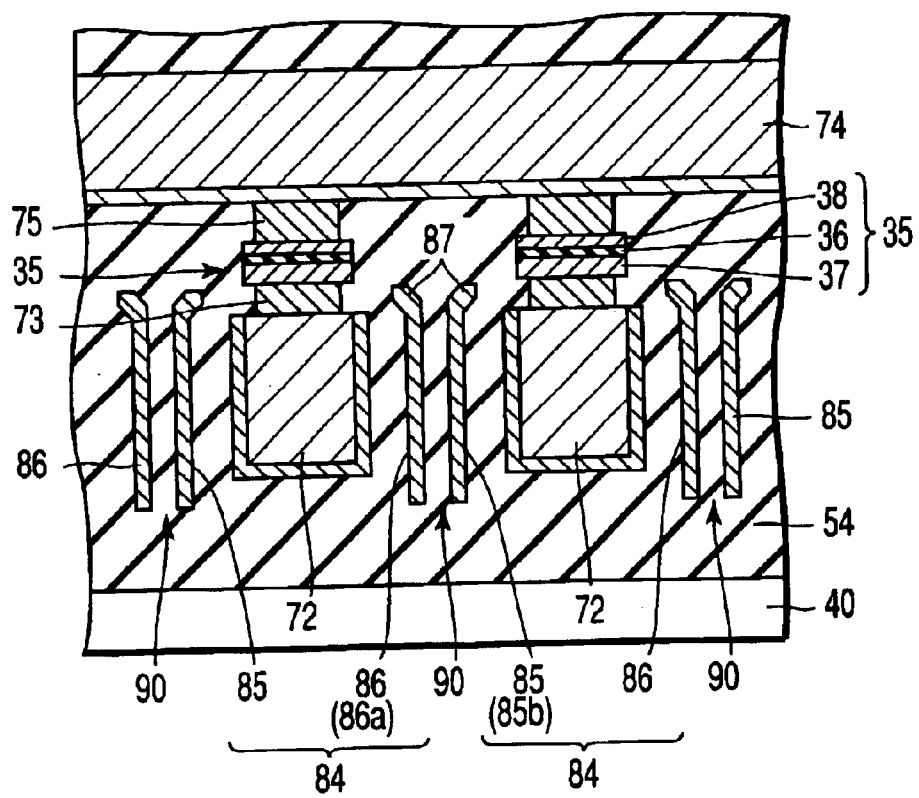
FIG. 8 is a sectional view showing a part of an MRAM according to a modification of the second embodiment, which corresponds to the line VI—VI in FIG. 5.

FIG. 8 is a sectional view showing a part of an MRAM according to a modification of the second embodiment, which corresponds to the line VI—VI in FIG. 5. In this modification, a partition wall 90 having a different structure from the partition wall 88 shown in FIG. 6 is disposed between two word lines 72 adjacent to each other.

Specifically, between two word lines 72 adjacent to each other, the right film member 86 of the left word line 72 (see reference symbol 86a in FIG. 8) and the left film member 85 of the right word line 72 (see reference symbol 85b in FIG. 8) are completely separated (i.e., electrically insulated from each other). This structure can be formed by removing the bottom of the U-shaped film including the film members 86a and 85b shown in FIG. 6, using anisotropic etching. The portion between the two film members 86a and 85b is filled with an insulating layer, so that a partition wall 90 is formed as a whole. The partition wall 90 extends in parallel with and midway between the two word lines 72.

According to this modification, a magnetic field generated by an electric current fed through the word line 72 is effectively concentrated near the MTJ element 35 by the film members 85 and 86. Since the adjacent film members 86a and 85b are magnetized reverse to each other, magnetic field leakage from the magnetized film members 85 and 86 is effectively shielded. As a consequence, it is possible to improve the margin of erroneous writing on adjacent MTJ elements due to the magnetic field leakage.

In the first and second embodiments, an MTJ element 35 including ferromagnetic layers sandwiching a tunnel barrier film is used as a magnetoresistance element. Alternatively, the first and second embodiments may be applied to a case where an element including ferromagnetic layers sandwiching a conductive film to utilize a GMR (Giant Magneto Resistive) effect is used as a magnetoresistance element.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic random access memory comprising:
   a magnetoresistance element configured to store data;
   an electric current drive line configured to selectively apply a magnetic field to the magnetoresistance element; and
   a magnetic circuit configured to hold the magnetic field applied from the electric current drive line,
   wherein the electric current drive line comprises a first side facing the magnetoresistance element, a second side reverse to the first side, and two lateral sides between the first and second sides, and
   the magnetic circuit comprises a pair of film members consisting essentially of a ferromagnetic material and extending along the two lateral sides of the electric current drive line, such that portions facing the first and second sides of the electric current drive line are left open.

2. The memory according to claim 1, wherein the pair of film members consist essentially of a soft-magnetic material having a high magnetic permeability.

3. The memory according to claim 1, wherein each of the pair of film members has a height larger than a distance between the first and second sides of the electric current drive line.

4. The memory according to claim 1, wherein the pair of film members are electrically insulated from the electric current drive line by insulating layers.

5. The memory according to claim 1, wherein the first side of the electric current drive line is electrically connected to the magnetoresistance element.

6. The memory according to claim 1, wherein the first side of the electric current drive line is electrically insulated from the magnetoresistance element by an insulating layer.

7. The memory according to claim 1, wherein, in the electric current drive line, a ratio of a distance between the first and second sides relative to a distance between the two lateral sides is 1 or more.

8. The memory according to claim 1, wherein the magnetoresistance element, the electric current drive line, and the magnetic circuit comprise two adjacent magnetoresistance elements, two adjacent electric current drive lines, and two adjacent magnetic circuits, respectively, and adjacent two film members of the two magnetic circuits disposed between the two electric current drive lines form a partition wall at a near center between the two electric current drive lines.

9. The memory according to claim 8, wherein an insulating layer is interposed between the adjacent two film members.

10. The memory according to claim 9, wherein the adjacent two film members are electrically insulated from each other.

11. The memory according to claim 8, wherein the adjacent two film members comprise parts of an integrated film.

12. A magnetic random access memory comprising:
a memory cell array including memory cells respectively disposed at addresses arranged in a matrix format, each of the memory cells including a magnetoresistance element as a storing element;
word lines respectively connected to rows of the memory cell array;
bit lines respectively connected to columns of the memory cell array;
partition walls extending along and between respective pairs of electric current drive lines, which are the word lines or the bit lines configured to selectively apply magnetic fields respectively to the magneto resistive elements, wherein each of the partition walls comprises first and second film members consisting essentially of a ferromagnetic material and forming parts of first and second magnetic circuits, which are configured to respectively hold magnetic fields applied from first and second electric current drive lines extending adjacent to and parallel with each other, and the first and second film members are electrically insulated from the first and second electric current drive lines respectively by insulating layers.

13. The memory according to claim 12, wherein an insulating layer is interposed between the first and second film members.

14. The memory according to claim 13, wherein the first and second film members are electrically insulated from each other.

15. The memory according to claim 12, wherein the first and second film members comprise parts of an integrated film.

16. The memory according to claim 12, wherein each of the first and second film members has a height larger than that of the electric current drive lines.

17. The memory according to claim 12, wherein the electric current drive lines are electrically connected to the magnetoresistance elements.

18. The memory according to claim 12, wherein the electric current drive lines are electrically insulated from the magnetoresistance elements by an insulating layer.

19. The memory according to claim 12, wherein the first and second film members consist essentially of a soft-magnetic material having a high magnetic permeability.

* * * * *